United States Patent [19]

Kanai et al.

[11] Patent Number: 4,908,329

[45] Date of Patent: Mar. 13, 1990

[54] PROCESS FOR THE FORMATION OF A FUNCTIONAL DEPOSITED FILM CONTAINING GROUPS II AND VI ATOMS BY MICROWAVE PLASMA CHEMICAL VAPOR DEPOSITION PROCESS

[75] Inventors: Masahiro Kanai, Tokyo; Tsutomu Murakami, Nagahama; Takayoshi Arai, Nagahama; Soichiro Kawakami, Nagahama, all of Japan

[73] Assignee: Canon Kabushiki Kaisha, Tokyo, Japan

[21] Appl. No.: 302,243

[22] Filed: Jan. 27, 1989

[30] Foreign Application Priority Data

Feb. 1, 1988 [JP] Japan .................................. 63-21800

[51] Int. Cl.<sup>4</sup> .......................................... H01L 21/20
[52] U.S. Cl. .......................... 437/101; 148/DIG. 45; 148/DIG. 64; 427/38; 437/5; 437/87; 437/170; 437/914; 437/937
[58] Field of Search ................... 148/DIG. 1, DIG. 6, 148/22, 45, 64, 79, 110, 122, 153, 169; 156/610–614; 427/38, 39; 437/2–5, 18, 81, 101, 87, 170–172, 914, 916, 937

[56] References Cited

U.S. PATENT DOCUMENTS

| | | | |
|---|---|---|---|
| 4,401,054 | 8/1983 | Matsuo et al. | 118/50.1 |
| 4,421,592 | 12/1983 | Shuskus et al. | 156/613 |
| 4,566,403 | 1/1986 | Fournier | 118/718 |
| 4,657,777 | 4/1987 | Hirooka et al. | 427/39 |
| 4,673,589 | 6/1987 | Standley | 427/41 |
| 4,676,195 | 6/1987 | Yasui et al. | 427/39 |
| 4,798,167 | 1/1989 | Ishihara et al. | 118/723 |
| 4,832,778 | 5/1989 | Davis et al. | 118/728 |
| 4,837,113 | 6/1989 | Luttmer et al. | 427/38 |

FOREIGN PATENT DOCUMENTS

| | | |
|---|---|---|
| 0071369 | 4/1983 | Japan . |
| 0063376 | 4/1985 | Japan . |
| 0202438 | 9/1986 | Japan . |
| 0276977 | 12/1986 | Japan . |
| 0077479 | 4/1987 | Japan . |
| 0116775 | 5/1987 | Japan . |
| 0150709 | 7/1987 | Japan . |

Primary Examiner—Brian E. Hearn
Assistant Examiner—William Bunch
Attorney, Agent, or Firm—Fitzpatrick, Cella, Harper & Scinto

[57] ABSTRACT

A process for the formation of a functional deposited film containing atoms belonging to the group II and VI of the periodical table as the main constituent atoms by introducing, into a film forming space for forming a deposited film on a substrate disposed therein, a group II compound (1) and a group VI compound (2) as the film-forming raw material and, if required, a compound (3) containing an element capable of controlling valence electrons for the deposited film as the constituent element each in a gaseous state, or in a state where at least one of such compounds is previously activated in an activation space disposed separately from the film forming space, while forming hydrogen atoms in an excited state which cause chemical reaction with at least one of the compounds (1), (2) and (3) in the gaseous state or in the activated state in an activation space different from the film forming space and introducing them into the film-forming space, thereby forming the functional deposited film on the substrate, wherein the hydrogen atoms in the excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atom is controlled.

10 Claims, 7 Drawing Sheets

ANGLE OF THE SUBSTRATE
TO THE METAL MESH MEMBER(°)

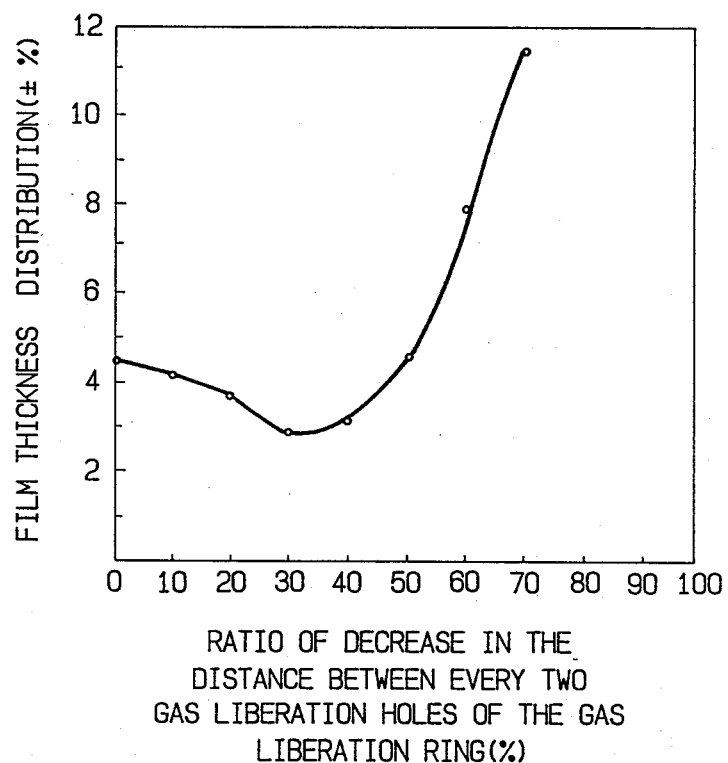

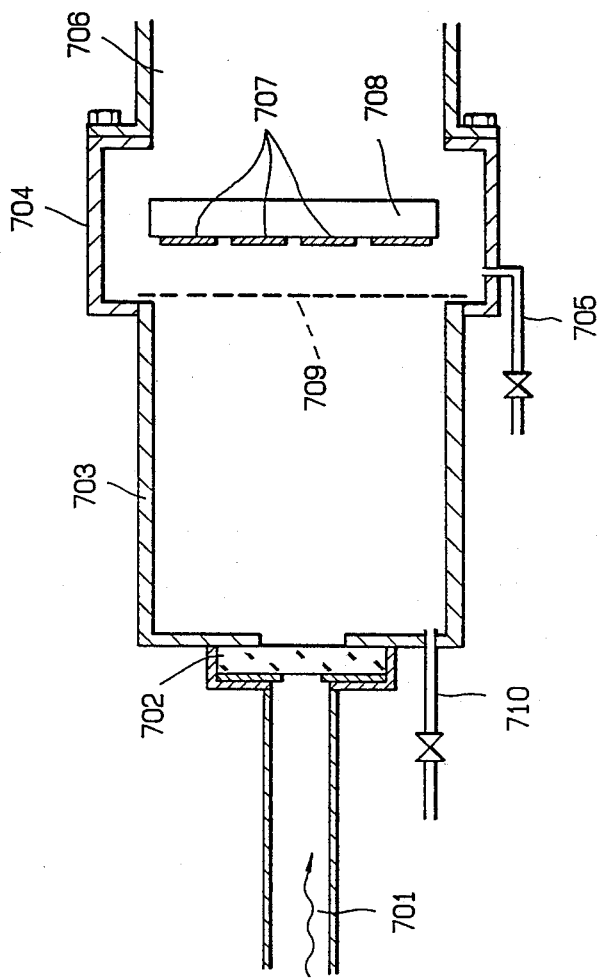

PROCESS FOR THE FORMATION OF A FUNCTIONAL DEPOSITED FILM CONTAINING GROUPS II AND VI ATOMS BY MICROWAVE PLASMA CHEMICAL VAPOR DEPOSITION PROCESS

FIELD OF THE INVENTION

The present invention relates to an improved process for forming a functional deposited film containing group II and VI atoms, which is usable especially as a photo-conductive member for semiconductor devices, photosensitive devices for use in electrophotography, image input line sensors, image pickup devices, photo-electromotive force devices or the like.

More specifically, the present invention relates to an improved process for efficiently forming a functional deposited film containing group II and VI atoms as the main constituent atoms on a substrate by forming hydrogen atoms in excited state by using a hydrogen gas or a gas mixture composed of a hydrogen gas and a rare gas with microwave plasmas generated in a plasma generation chamber disposed in a cavity resonator integrated with two impedance matching circuits in a microwave circuit and bringing the hydrogen atoms in excited state into contact with a film-forming raw material gas or a separately activated film-forming raw material gas in a film forming chamber and thereby causing chemical reactions among them while controlling the excited state of the hydrogen atoms.

BACKGROUND OF THE INVENTION

For the formation of a functional deposited film, particularly a semiconductor deposited film, there has been employed a suitable film-forming process with due regards to electrical and physical properties required therefor and also to its application use.

For example, there have been attempted plasma CVD process, reactive sputtering process, ion plating process, light CVD process, thermal-induced CVD process, MO CVD process, MBE process, etc. and several of which have been employed and put to industrial use as being suitable for the formation of a desired semiconductor device.

However, even in the case of the plasma CVD process which has been employed most popularly, the electrical and physical properties of a resulting deposited film are not said quite satisfactory in view of the preparation of a desired semiconductor device and it sometime lacks in the plasma stability and reproducibility upon forming the deposited film and in addition, it may sometime cause a remarkable reduction in the yield.

For overcoming these problems, there has been proposed, for example, by Japanese Patent Laid-Open Nos. Sho 61-189649 and Sho 61-189650, a process for increasing the film deposition rate thereby remarkably improving the productivity of the film upon depositing to form a group II-VI semiconductor film of high quality by HR-CVD process (hydrogen Radical Assisted CVD process).

Further, as means for forming a high density plasma efficiently by using microwave of about 2.45 GHz, a method for arranging electromagnets around a cavity resonator thereby establishing conditions for ECR (electron cyclotron resonance) has been proposed, for example, by Japanese Patent Laid-Open Nos. Sho 55-141729 and Sho 57-133636, as well as formation of various kinds of semiconductor thin films by utilizing high density plasma has also been reported in academic conferences, etc.

By the way, in the HR-CVD process described above, although the hydrogen atoms in excited state (hydrogen radicals) have an important role for the formation of a deposited film regarding the control of the property and the uniformity, there has been made no sufficient study for controlling the excited state of the hydrogen atoms in a great amount and uniformly upon forming the deposited film and controlling the chemical reaction upon forming the deposited film under the control of the excited state, thereby optionally and stably controlling the property of the deposited film formed, and there are still left several problems to be solved.

On the other hand, in the microwave plasma CVD apparatus using ECR, there are several problems. That is: the pressure in a plasma generation chamber has to be kept to less than about $10^{-3}$ Torr for establishing ECR conditions, thus undergoing restriction for the pressure upon forming the deposited film: the mean free path of gaseous molecules is increased ($\sim 1$ m) under such a level of pressure, by which the film-forming raw material gas is diffused near the microwave introduction window, decomposed and reacted to thereby cause adherence of the deposited film to the microwave introduction window or to the inner wall of the cavity resonator, thereby making electric discharge instable: and the film adhered to the substrate is contaminated by the defoliation and the scattering of the adhered film. Further, it has also been pointed out several problems. That is, a plasma generated in the plasma generation chamber is diversed along the diversing magnetic field of the electromagnets into the film forming chamber, by which the substrate is exposed to the plasma at relatively high density. Accordingly, the formed deposited film is liable to be damaged by charged particles, etc. and this causes limitation in the improvement of properties of a film to be formed. In the step of laminating a plurality of deposited films in the process of preparing a semiconductor device, the boundary characteristic is apt to reduce because of damages caused by the charged particles, etc., and this makes it difficult to improve the characteristics of the semiconductor device.

SUMMARY OF THE INVENTION

The principal object of the present invention is to overcome the foregoing various problems in the prior art process for forming deposited films and provide an improved process for forming a functional deposited film comprising the groups II and VI atoms as the main constituent atoms, over a large area, with satisfactory uniformity, stably and at good reproducibility, which is effective for preparing a semiconductor device of high quality.

Another object of the present invention is to provide an improved process for the formation of a functional deposited film containing atoms belonging to the groups II and VI of the periodical table as the main constituent atoms by introducing, into a film forming space containing a substrated disposed therein on which a film is to be deposited, a film-forming raw material gas or the raw material gas previously activated by using an activation energy in an activation space disposed separately from the film forming space, while forming hydrogen atoms in excited state, which cause chemical reaction with the film-forming raw material gas or the raw material gas in activated state, from a hydrogen gas or a gas mixture composed of a hydrogen gas and a rare gas in an activation space different from the film forming space by means of microwave energy as the activation energy, introducing the thus formed hydrogen atoms in excited state into the film-forming space and bringing them into contact with the film-forming raw material gas or the activated film-forming raw material gas to cause chemical reactions among them, thereby forming a desired deposited film on the substrate maintained at a predetermined temperature, wherein the hydrogen atoms in excited state are formed by means of a microwave plasma generated in a plasma generation chamber disposed in a cavity resonator integrated with two impedance matching circuits in a microwave circuit and the excited state of the hydrogen atoms is controlled.

According to the process of the present invention, a functional deposited semiconductor film comprising group II and VI atoms of the periodical table (hereinafter simply referred to as "group II and VI elements") as the main constituent atoms (this film will be hereinafter referred to as "group II–VI deposited semiconductor film") and having uniform film quality, uniform film thickness and various excellent properties at high film quality can be formed at a remarkably improved film forming rate, stably, with good reproducibility and efficiently.

Further, according to the process of the present invention, the productivity for forming the functional deposited film can be improved remarkably as compared with conventional processes and the effective mass production of the functional deposited film can be attained.

Furthermore, according to the process of the present invention, the temperature for the substrate upon forming the deposited film can be lowered as compared with that in the conventional process, as well as the film quality can be controlled easily, stably and with good reproducibility by controlling the excited state of the hydrogen atoms, the introduction amount of the film-forming raw material compounds, etc.

BRIEF DESCRIPTION OF THE DRAWINGS

FIG. 6 is a view illustrating a relationship of the film thickness distribution in the deposited film formed relative to the decreasing rate of the interval for the gas liberation apertures of the gas liberation rings illustrated in FIG. 2(a) through FIG. 2(c) in the apparatus used upon practicing the microwave plasma CVD process according to the present invention; and FIG. 7 is a schematic cross sectional view for the constitution of a conventional microwave plasma CVD device.

DETAILED DESCRIPTION OF THE INVENTION

Figure 1:
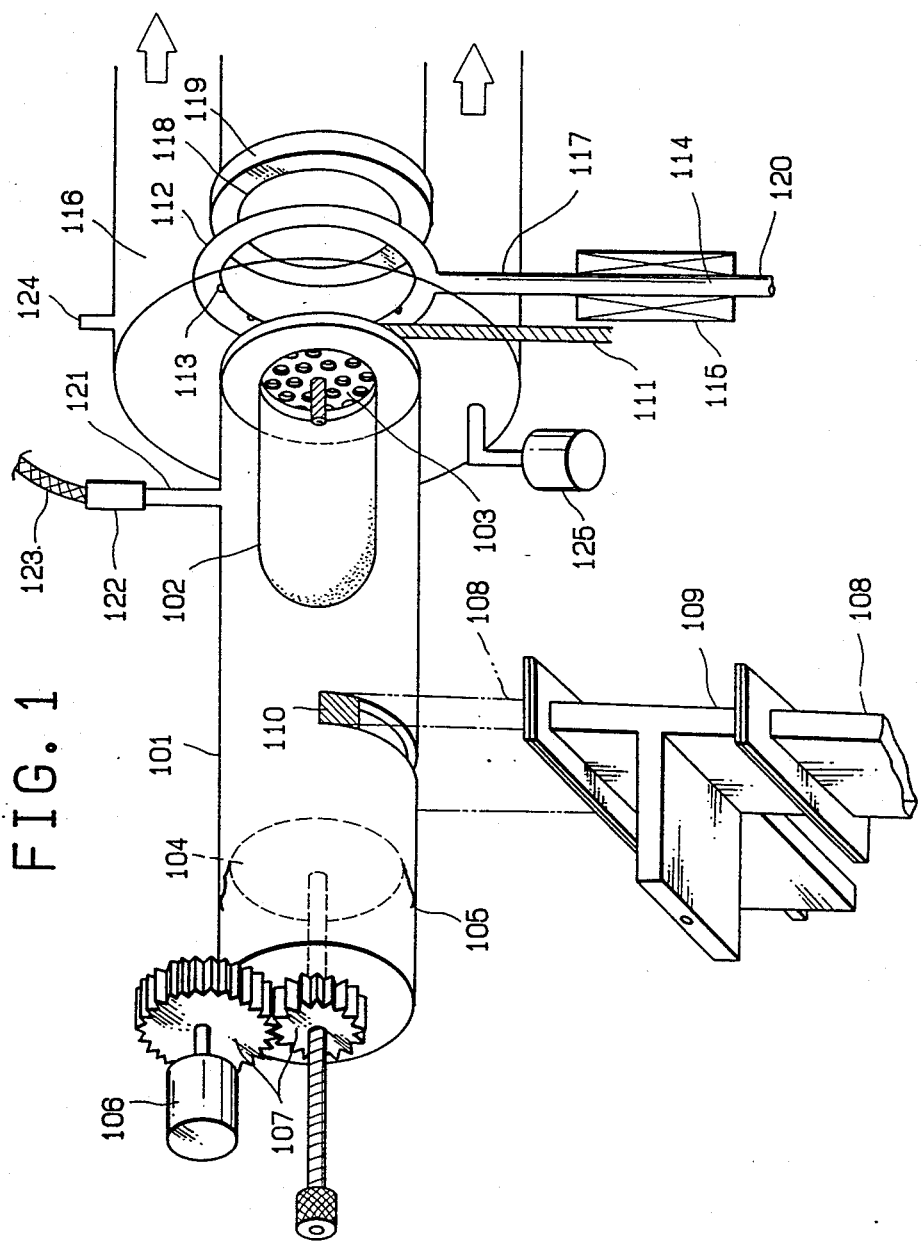
FIG. 1 is a perspective view for schematically illustrating a constitutional example of the apparatus suitable for practicing the process for forming a group II–VI deposited semiconductor film by a microwave plasma CVD process according to the present invention.

The present inventors have made earnest studies for overcoming the foregoing various problems in the prior art process for forming a deposited film for attaining the objects of the present invention and, as a result, have obtained a knowledge that hydrogen atoms in optional excited state can be supplied stably, with good reproducibility and efficiently by disposing a plasma generation chamber in a cavity resonator integrated with two impedance matching circuits in a microwave circuit and conducting microwave plasma discharge by using a hydrogen gas or a gas mixture composed of a hydrogen gas and a rare gas.

The present invention has been accomplished as a result of further studies based on the above-mentioned knowledge and the feature thereof resides in a process for the formation of a deposited film by introducing, into a film forming space for forming a deposited film on a substrate, a compound (1) and a compound 2) represented respectively by the following general formulae (I) and (II) as the film-forming raw materials and, if required, a compound (3) containing an element capable of controlling valence electrons for the deposited film as the constituent element each in a gaseous state or in a state where at least one of such compounds is previously activated in an activation space disposed separately from the film forming space, while forming hydrogen atoms in excited state which cause chemical reaction with at least one of the compounds in the gaseous state or in the activated state in an activation space different from the film forming space and introducing them into the film-forming space, thereby forming a deposited film on the substrate, wherein the hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$R_nM_m \qquad (I)$$
$$A_aB_b \qquad (II)$$

where m represents a positive integer equal to or multiple integer of the valence number for R, n represents a positive integer equal to or multiple integer of the valence number for M, M represents an element belonging to the group II of the periodical table, R represents a member selected from hydrogen (H), halogen (X) and hydrocarbon group, a represents a positive integer equal to or multiple integer of the valence number for B, b represents a positive integer equal to or multiple integer of the valence number for A and A represents an element belonging to the group VI of the periodical table, B represents a member selected from hydrogen (H), halogen (X) and hydrocarbon group.

Method of controlling the excited state of the hydrogen atoms is attained by measuring emission intensity of $H_\alpha$, $H_\beta$ as the excited state of hydrogen by emission spectrophotometry and controlling one or more of microwave power charged to the cavity resonator, the impedance matching condition, hydrogen gas flow rate or the flow rate of the gas mixture composed of hydrogen gas and rare gas and the total pressure.

The impedance matching circuit in the cavity resonator integrated with two impedance matching circuits in the microwave circuit means restriction bodies each disposed to a cavity length varying plunger and to a junction portion between a microwave waveguide tube and a cavity resonator and the condition for the impedance matching is controlled by adjusting such restriction body.

The impedance matching circuit may be a cavity length varying plunger and an E-H tuner or a three-stub tuner.

Further, the plasma generation chamber is constituted with a metal mesh member and a microwave permeable bell jar and connected by way of the metal mesh member to the film forming space, and the hydrogen atoms in excited state are introduced through the metal mesh member into the film forming space.

On the other hand, a substrate is disposed at an angle of 30° or less relative to the horizontal axis of the metal mesh surface and at a distance within 100 mm from the metal mesh surface. The compounds (1), 2) and (3) in the gaseous state or activated state are introduced into the film forming space by way of gas liberation means disposed between the metal mesh surface and the substrate.

The gas liberation means are disposed so as to surround, the substrate in an annular configuration, and the amount of gases liberated from each of the gas liberation apertures is made uniform, by gradually decreasing the interval of the gas liberation apertures from the side of introducing the gas liberation means toward the final liberation aperture, by gradually enlarging the size of the gas liberation aperture from the side of introducing the gas liberation means toward the final liberation aperture or by uniformly distributing the gas liberation apertures at least in the plane of the substrate and gradually enlarging the size for each of the gas liberation apertures from the side of introducing the gas liberation means toward the central portion.

When a desired functional deposited film is formed by the process according to the present invention, compounds represented respectively by the general formulas (I) and (II) described above and, if required, a compound containing an element capable of controlling valence electrons for the deposited film as the constituent element, as well as hydrogen atoms controlled separately for the excited state thereof are introduced in a gaseous state or activated state into the film forming chamber to cause chemical reactions among them, thereby forming a semiconductor thin film containing groups II and VI atoms as the main constituent atoms on the substrate. In this case, the crystallinity, hydrogen content, etc. of the resulting group II-VI semiconductor film can be controlled stably with good reproducibility.

The excited state of the atomic hydrogen in the present invention is determined from light emission observed in a microwave plasma of a hydrogen gas or a gas mixture composed of a hydrogen gas and a rare gas. Specifically, light emission from the microwave plasma is measured by emission spectrophotometry and the excited state is determined by the intensity ratio for the emission line at 656 nm belonging to H and at 486 nm belonging to $H_\beta$ among the emission lines of atomic hydrogens (H*), and at least one of the parameters, i.e., the microwave power charged to the cavity resonator, the impedance matching condition, the hydrogen gas flow rate or the flow rate of the gas mixture composed of hydrogen gas and rare gas, and the total pressure is properly controlled so as to attain the aimed intensity ratio.

In the present invention, it is preferred to control the intensity ratio of $H_\alpha/H_\beta$ to preferably, from 1/1 to 1000/1, more preferably, from 10/1 to 500/1 for controlling the excited state of the hydrogen atoms.

Within the range of the intensity ratio as described above, combination of the kind and the temperature of the substrate is, particularly, a determinative factor for the film quality, etc. and a desired deposited group II-VI semiconductor film of desired film quality and property can be formed by properly combining them. Accordingly, it is necessary in the present invention to employ an emission spectrophotometer having such a sensitivity as capable of measuring the intensity ratio described above.

In the present invention, since the monitor for the microwave plasma is situated at a position, relative to the flowing direction of the total gas, to the upstream of the gas liberation means for the compounds (1), (2) and (3), no substantial deposited film is formed thereon and stable monitoring is possible from the start to the end of the film formation.

As the compounds (1) and (2) represented by the general formulae (I) and (II) respectively and the compound (3) containing an element capable of controlling valence electrons for the deposited film as the constituent element used in the present invention, it is more preferred to select those spontaneously producing chemical species that cause molecular collision with the hydrogen atoms in excited state and take place chemical reaction thereby contributing to the formation of a deposited film on the substrate. If they are not desirably reactive with the hydrogen atoms in excited state or have not high activity in the usual state of their existence, it is necessary to provide the compounds (1), (2) and (3) with such an excitation energy as not completely dissociating M and A in the general formulae from the compounds (1), (2) and (3), particularly, compounds (1) and (2) to excite the compounds (1) and (2) before and during film formation so that they can take place chemical reaction with the hydrogen atoms in excited state. Those compounds that may be excited to be in such excited state may be used as the compounds (1) and (2) in the process of the present invention.

As the elements for $R_nM_m$ of the compound (1) and $A_aB_b$ of the compound 2) represented respectively by the general formula (I) and (II) that can be used effectively in the present invention, there can be mentioned those as described below.

Specifically, there can be mentioned those elements belonging to the group II of the periodical table, e.g., those elements belonging to group IIB such as Zn, Cd and Hg as "M", and those elements belonging to the group VI of the periodical table, e.g., those elements belonging to group VIA such as O, S, Se and Te as "A".

In the case of obtaining a group II–VI semiconductive deposited thin film by the process according to the present invention, there can be mentioned an organic metal compound, particularly, alkyl compound containing group II metal as the compound (1), and hydride, halide or organic metal compound, particularly, alkyl compound of group VI element as the compound (2) as the effective raw material.

Specifically, as the compound (1) containing the group II element, there can be mentioned:
$Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(C_4H_9)_2$, $Hg(CH_3)_2$, $Hg(C_2H_5)_2$, $Hg(C_6H_5)_2$, $Hg[C=(C_6H_5)]_2$, etc.

As the compound (2) containing the group VI element, there can be mentioned:
$NO$, $N_2O$, $CO_2$, $CO$, $H_2S$, $SCl_2$, $S_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, $Te(CH_2H_5)_2$, etc.

As the compound (3) containing the element for the valence electron control as the constituent element in the process according to the present invention, it is preferred to select those compounds that are gaseous under normal temperature and normal pressure, or at least gaseous under the deposited film forming conditions, and easily gasifiable by an appropriate gasifying device.

As the compound (3) used in the present invention, in the case of obtaining a group II–VI semiconductor film, there can be mentioned, for example, those compounds containing one or more of elements selected from those belonging to the groups I, III, IV and V of the periodical table as the effective raw material.

Specifically as the compound containing group I element, there can be mentioned, preferably, $LiC_3H_7$, $Li(sec-C_4H_9)$, $Li_2S$, $Li_2N$. etc.

There can be mentioned as the compound containing group III element:
$BX_3$, $B_2H_6$, $B_4H_{10}$, $B_5H_9$, $B_5H_{11}$, $B_6H_{10}$, $B(CH_3)_3$, $B(C_2H_5)_3$, $B_6H_{12}$, $AlX_3$, $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3Cl_3$, $Al(i-C_4H_9)_3$, $Al(i-C_3H_7)_3$, $Al(C_3H_7)_3$, $Al(OC_4H_9)_3$, $GaX_3$, $Ga(OCH_3)_3$, $Ga(OC_2H_5)_3$, $Ga(OC_3H_7)_3$, $Ga(OC_4H_9)_3$, $Ga(CH_3)_3$, $Ga_2H_6$, $GaH(C_2H_5)_2$, $Ga(OC_2H_5)(C_2H_5)_2$, $In(CH_3)_3$, $In(C_3H_7)_3$, $In(C_4H_9)_3$, etc.:
as the compound containing group V element;
$NH_3$, $HN_3$, $N_2H_5N_3$, $N_2H_4NH_4N_3$, $PX_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, $P_4H_2$, $PH_3$, $AsH_3$, $AsX_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)_3$, $SbX_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$, etc. in which X represents a halogen (F, Cl, Br, I).

These starting materials may be used alone or in a combination of two or more of them.

As the compound containing silicon which is a compound containing group IV element, there can be mentioned specifically a linear silane or silicon halide represented by the formula: $Si_uY_{2u+2}$, where u represents an integer of 1 or greater and Y represents at least one element selected from F, Cl, Br and I: a cyclic silane or silicon halide represented by the formula: $Si_vY_{2v}$, where v represents an integer of 3 or greater and Y has the same meanings as described above: and a linear or cyclic silicon compound or an organic silicon compound having alkyl group, etc. represented by the formula: $Si_uH_xY_y$, where u and Y have the same meanings as described above and $x+y=2u$ or $2u+2$.

As the compound containing germanium, there can be mentioned, for example, a linear germane or germanium halide represented by the formula: $Ge_uY_{2u+2}$, where u represents an integer of 1 or greater and Y represents at least one element selected from F, Cl, Br and I: a cyclic germane or germanium halide represented by the formula: $Ge_vY_{2v}$, where v represents an integer of 3 or greater and Y has the same meanings as described above: and a linear or cyclic germanium compound and organic germanium compound having alkyl group, etc. represented by the formula: $C_uH_xY_y$, where u and Y have the same meanings as described above and $x+y=2u$ or $2u+2$.

Further, as the compounds containing carbon, there can be used those linear or cyclic hydrocarbon compounds in which hydrogen atoms may partially or entirely be substituted with halogen atoms, for example, a linear carbon halide represented by the formula: $C_uY_{2u+2}$, where u represents an integer of 1 or greater and Y represents at least one element selected from H, F, Cl, Br and I: a cyclic carbon halide represented by the formula: $C_vY_{2v}$, where v represents an integer of 3 or greater and Y has the same meanings as described above: and a linear or cyclic carbon compound represented by the formula: $C_uH_xY_y$, where u and Y have the same meaning as described above and $x+y=2u$ or $2u+2$.

Furthermore, as the compound containing tin, there can be mentioned: $SnH_4$, $SnCl_4$, $SnBr_4$, $Sn(CH_3)_4$, $Sn(C_2H_5)_4$, $Sn(C_3H_7)_4$, $Sn(C_4H_9)_4$, $Sn(OCH_3)_4$, $Sn(OC_2H_5)_4$, $Sn(i-OC_3H_7)_4$, $Sn(t-OC_4H_9)_4$, etc.

As the compound containing lead, there can be mentioned $Pb(CH_3)_4$, $Pb(C_2H_5)_4$, $Pb(C_4H_9)_4$, etc.

The raw materials described above may be used alone, or two or more of them may be used in admixture.

In a case where the raw material described above is gaseous under the normal temperature and normal pressure, the amount introduced into the film forming space or activation space is controlled by a mass flow controller, etc. In a case where the material is liquid, it is gasified by using a rare gas such as Ar or He or gaseous hydrogen as a carrier gas and, as required, by using a bubbler capable of temperature control. In a case where the material is in a solid state, it is gasified by using a rare gas such as Ar or He or gaseous hydrogen as a carrier gas and using a heat sublimation furnace and the amount of introduction is controlled mainly by the control for the carrier gas flow rate and the temperature.

The hydrogen atoms in excited state used in the present invention are introduced into the film forming space simultaneously with the formation of a deposited film in the space and chemically react with the compounds (1) and 2) containing the elements as the main constituent of the deposited film to be formed and/or the compound (1) in excited state and/or the compound (2) in excited state. As a result, a desired group II–VI deposited film having a desired function is formed on a substrate at a lower substrate temperature and more easily as compared with the usual case.

For previously activating the compounds (1), (2) and (3) in the activation space disposed separately from the film forming space, activation energy such as of heat, light and electric discharge can be mentioned as the energy that is applied to the activation space.

Specifically, there can be mentioned heat energy source by ohmic heating, infrared heating, etc., light energy source such as of laser beams, mercury lamp rays, halogen lamp rays, etc. and electric discharge energy source such as of microwaves, RF, low frequency and DC. Such activation energy may be applied in the activation space alone or in combination of two or more of them. For effectively utilizing the effect of the activation energy, the catalytic effect may also be used in combination.

In the present invention, a hydrogen gas or a gas mixture composed of a hydrogen gas and a rare gas is used for forming the hydrogen atoms in excited state. If a microwave plasma can not be stabilized or desired plasma is not generated only by means of gaseous hydrogen, it is effective to properly mix rare gas.

As the rare gas used in the present invention, there can be preferably mentioned He, Ne, Ar, Kr, Xe and Rn.

Next, explanation will be made for the method of forming a microwave plasma having a cavity resonator structure integrated with two impedance matching circuits in a microwave circuit used in the present invention.

For the comparison, the method of forming a microwave plasma used so far will be explained at first. FIG. 7 shows a schematic cross sectional view for the constitution of the conventional microwave CVD apparatus.

In FIG. 7, there are shown a rectangular waveguide tube 701, a microwave introducing window 702, a plasma generation chamber 703, a film forming chamber 704, gas supply pipes 705, 710, an exhaust port 706, objects 707 to be processed, an object holder 708 and a metal mesh member 709 respectively.

As shown in FIG. 7, the apparatus comprises the plasma generation chamber 703 and the film forming chamber 704 by plasma, in which the plasma forming chamber 703 and the film forming chamber 704 are partitioned by the metal mesh member 70 and permeation thereof is controlled so that microwave and charged particles are not introduced directly into the film forming chamber 704. The plasma generation chamber 703 has a structure as a cavity resonator, and the microwave propagated through the rectangular waveguide tube 701 is introduced into the plasma generation chamber 703 by way of the microwave introducing window 702 comprising dielectric material such as quartz ($SiO_2$), aluminum ceramics ($Al_2O_3$), teflon, etc. The objects 707 to be processed are disposed in the film forming chamber 704, which is provided with the gas supply pipe 705 and the exhaust port 706 for evacuating the plasma generation chamber 703 and the film forming chamber 704.

Upon actuating the microwave plasma generation apparatus thus constituted, the microwave is introduced from the rectangular waveguide tube 701 into the plasma generation chamber 703, and hydrogen gas, etc. as introduced through the gas introduction port 710 is converted into plasmas by the electric field energy of the microwave to form a great amount of hydrogen atoms in excited state. The hydrogen atoms in excited state are introduced by way of the metal mesh member 709 into the film forming chamber 704 where they collide against gases supplied from the gas introduction pipe 705 and cause chemical reactions among then to thereby from a deposited film on the objects 707 to be processed.

However, in the case of using the conventional microwave plasma generation apparatus having the aforementioned constitution, if the rectangular waveguide tube 701 is clamped with the plasma generation chamber 703 as the cavity resonator, since the input impedance is not matched, there is a problem that most of the electric field energy of the microwave is reflected, failing to effectively utilize the energy.

As one of the countermeasures for the problem, there has been employed a method of arranging electromagnets around the cavity resonator to attain ECR (Electron Cyclotron Resonance) (refer to Japanese Patent Laid-Open No. Sho 55-141729). However, a magnetic flux density as high as 875 gauss is required in this method, the apparatus is rather large in size and heavy in weight. Further, the chamber is so designed that it usually constitutes a cavity resonator in vacuum. In view of this, if a plasma is generated by electric discharge, since the refractive index of the plasma is smaller than 1, it no more functions as the cavity resonator (refer to "Discharge Handbook" edited by Electric Society, Part 4, Chapter 2, 298 p). In addition, in the case of forming a static magnetic field by the electromagnets, since electric current changes under heating by the coiled wire member, not only a considerable time is required for stably preparing ECR conditions (that is, magnetic flux density as high as 875 gauss) while suppressing such change, but also there is a problem that if it goes out of the ECR conditions, the absorption rate of microwave is reduced and the improvement in the efficiency for utilizing the electric field is difficult till it is stabilized.

Accordingly, in the present invention, it has been found effective as the means for overcoming the foregoing problems to constitute such a structure that can operate as a cavity resonator irrespective of the presence or absence or the density of a plasma and to dispose a bell jar as the plasma generation chamber in the cavity resonator for exciting a TM mode.

Specifically, in the cavity resonator structure, a cavity length varying plunger is disposed and the rectangular wave guide tube and the cylindrical cavity resonator are clamped with each other such that their axes are in perpendicular with each other as shown in FIG. 1. Furthermore, for carrying out the impedance matching, it is preferred to employ either one of a restriction disposed to the junction between the rectangular waveguide tube and the cavity resonator or an E-H tuner or three-stub tuner in combination with the cavity length varying plunger.

The bell jar for forming a plasma disposed in the cavity resonator has microwave permeability and it is formed with those materials capable of keeping gas tightness, for example, so-called new ceramics such as quartz ($SiO_2$), alumina ceramics ($Al_2O_3$), boron nitride (BN), silicon nitride ($Si_3N_4$), silicon carbide (SiC), beryllia (BeO), magnesia (MeO), zirconia ($ZrO_2$), etc.

The cavity length varying plunger is disposed to the bell jar on the side of introducing the microwave, that is, on the side of the atmosphere. Accordingly, since impedance can be matched by varying the cavity length in the atmospheric air, the cavity length can be adjusted easily depending on the absence or presence of a plasma or on the change of cavity resonance conditions due to the change of the plasma density, thereby enabling to generate a microwave plasma at good reproducibility and stability.

In the present invention, the metal mesh member disposed between the bell jar and the film forming space has a function as an end face plate for establishing the conditions for the cavity resonance and, accordingly, it is desirable that the diameter of the mesh member is preferably less than λ/2 and, optimally, less than λ/4 relative to the wavelength of the microwave in the tube used.

The metal mesh member has a shape of a metal gage, a thin metal plate perforated with round or polygonal apertures, etc. and may consist of material such as so-called metal element, for example, Al, Fe, Ni, Ti, Mo, W, Pt, Au, Ag and stainless steel or glass, ceramics applied with surface treatment with the metals described above by means of plating, sputtering, vapor deposition, etc. or metal composite material.

Further, it is desirable that the diameter and the distribution of apertures of the metal mesh member are varied in order to introduce the hydrogen atoms in excited state formed in the bell jar efficiently and uniformly into the film forming space. The entire porosity is preferably 10% or more, more preferably, 20% or more and, most suitably, 30% or more.

For attaining the uniform thickness and uniform property of a resulting deposited film on the substrate in the present invention, examinations have been made for the distance of the substrate from the metal mesh member and for the angle of the metal mesh member relative to the horizontal axes while forming also a ZnSe:H film as the II-VI semiconductor film and the following results were obtained.

Figure 3:
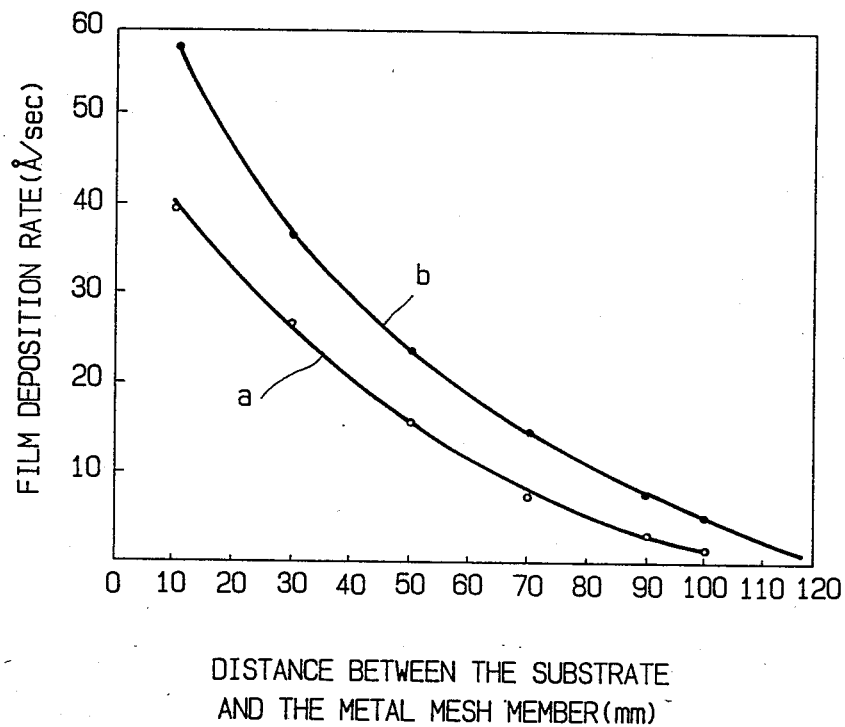
FIG. 3 is a graph illustrating a relationship of the film deposition rate to the distance between a substrate and a metal mesh member in the process for forming a deposited film by a microwave plasma CVD process according to the present invention.

FIG. 3 shows typical two examples each illustrating a relationship of the deposition rate of the deposited film formed relative to the distance between the substrate and the metal mesh member, in which the curve a comprising plotted marks "○" and the curve b comprising plotted marks "●", which were obtained respectively under the film forming conditions (A) and (B) shown in Table 1.

Figure 4:
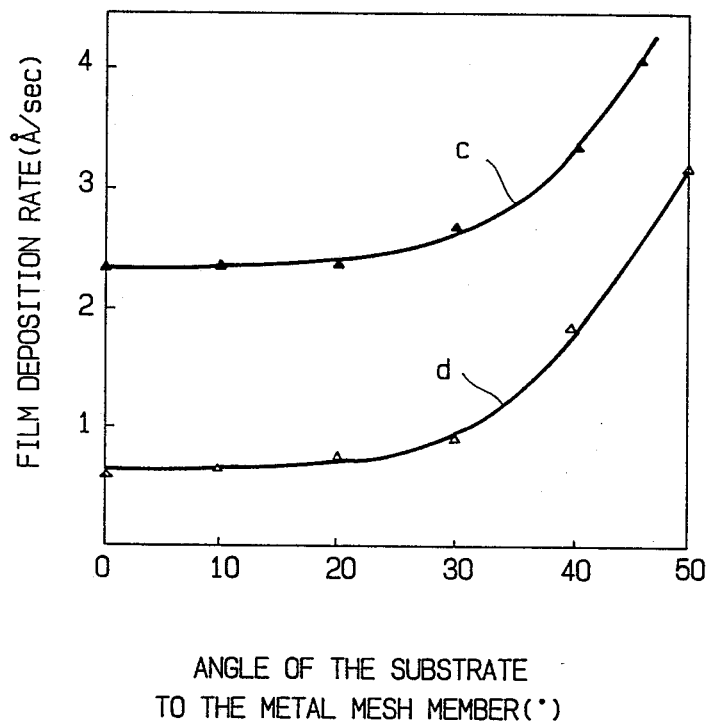
FIG. 4 is a graph illustrating a relationship of the difference in the film deposition rate in the formed deposited film relative to the angle between the substrate and the metal mesh member in the process for forming a deposited film by a microwave plasma CVD process according to the present invention.

FIG. 4 represents the film thickness distribution of the film deposited on the substrate as the difference of the deposition rate when the angle between the substrate and the metal mesh member is changed in a cases where the distance between the substrate and the metal mesh member is 40 mm (curve c plotted by "▲") and 80 mm (curve d, plotted by "△"), which was obtained under the film forming conditions (A).

As can be seen from FIG. 3, the deposition rate tends to decrease rapidly as the distance between the substrate and the metal mesh member is increased. Particularly, under the film forming condition (A), formation of a deposited film is scarcely observed if the distance exceeds 100 mm. Also under the film forming condition (B), the deposited film formed at the distance in excess of 100 mm has poor characteristic and is not suitable to practical use. In addition, from FIG. 4, it has been found that the distribution of the film thickness is rapidly increased if the angle between the substrate and the metal mesh member exceeds 30 degree in all of the positions for the substrate and, in relation therewith, the distribution of the film property is greately varied and the uniformity is greately reduced.

TABLE 1

| Item | Film forming condition | (A) | (B) |
|---|---|---|---|

TABLE 1-continued

| Substrate temperature | | 220° C. | |
|---|---|---|---|
| Compound (1)* | Zn(CH₃)₂ | | |
| | He | 8 sccm | |
| Compound (2)* | Se(CH₃)₂ | | |
| | He | 10 sccm | |
| Hydrogen atom-forming raw material gas | H₂ | 50 sccm | |
| | Ar | 150 sccm | |
| Pressure upon film formation | 0.05 Torr | 0.15 Torr | |
| Metal mesh member | Punched Al board (120 mmφ), 6 mm pore size, 45% porosity; uniform pore distribution | | |
| Gas liberation means for the compound containing group IV element | Annular liberation ring having 2 mmφ apertures, formed at 8 positions at an equal distance, disposed apart by 10 mm from the metal mesh member | | |
| Microwave charging power | 250 W | 350 W | |

*Compounds (1) and (2) were gasified with He as the carried gas and introduced into the film forming space.

The same examinations as described above were also conducted upon forming other group II-VI semiconductor thin films under several conditions and substantially the same results were obtained in each of the cases. Accordingly, in the present invention, it is defined that the distance between the substrate and the metal mesh member is preferably 100 mm or less, more preferably, 70 mm or less, and the angle between the substrate and the horizontal axis of the metal mesh member is preferably 30 degree or less and, more preferably, 20 degree or less, as necessary conditions in order to keep the uniformity for the distribution not only of the film thickness but also the film property to be within ±5%.

In addition, a further examination has been conducted on the gas liberation means for the compound (1), (2) and, if required, the compound (3) in the present invention in order to improve the uniformity of the film thickness distribution and the film property.

The range of pressure preferably used in the present invention is in an intermediate flow region situated between a viscosity flow and a molecular flow referred to in the fluid technology, for which the conductance calculation formula in the molecular flow region can not be used. Accordingly, in the present invention, the following experiments have been conducted while taking notice of the apertures size, distance and distribution of the gas liberation apertures disposed to the gas liberation means. As a result, there were obtained the results as shown in FIG. 5 and FIG. 6.

Figure 2A:
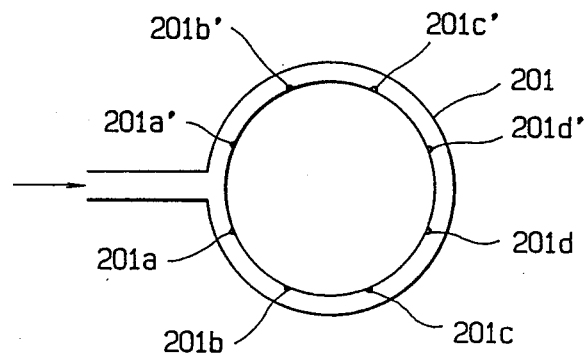
FIG. 2(a), FIG. 2(b) and FIG. 2(c) are, respectively, schematic explanatory views of the gas liberation rings to be employed in the apparatus shown in FIG. 1.
Figure 5:
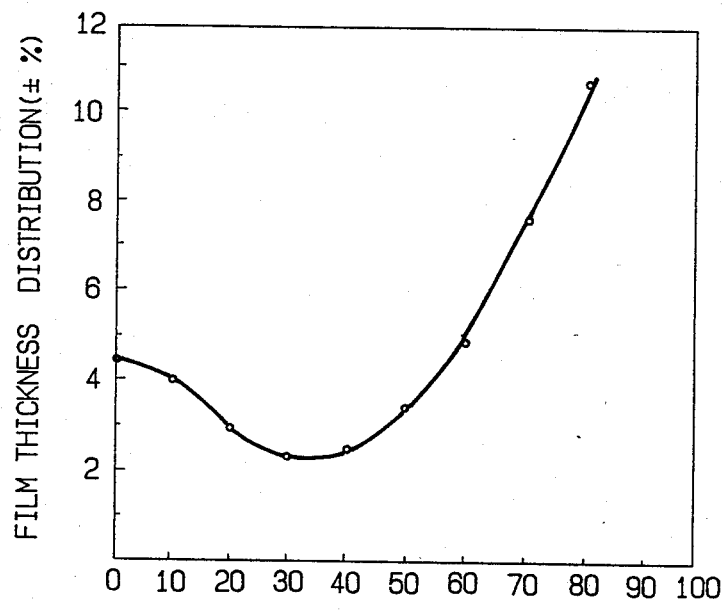
FIG. 5 is a graph illustrating a relationship of the film thickness distribution in a deposited film formed relative to the increasing rate of the diameter for the gas liberation apertures of the gas liberation rings illustrated in FIG. 2(a) through FIG. 2(c) in the apparatus used upon practicing the microwave plasma CVD process according to the present invention.

FIG. 5 illustrates the result obtained by forming a deposited film under the film forming condition (A) shown in Table 1, by setting the substrate at a distance of 30 mm and using the gas liberation ring 201 shown in FIG. 2(a).

In the gas liberation ring 201 shown in FIG. 2(a), eight liberation apertures 201a–201d, 201a'–201d' are apertured each at an equal distance, in which the aperture diameter is gradually increased from the liberation apertures 201a, 201a' nearest in the direction of the arrow (→) toward the downstream to the apertures 201d, 201d'. FIG. 5 illustrates the change of the film thickness distribution for the deposited films formed by using each of the gas liberation rings manufactured while varying the increasing rate for the aperture diameter from 0 to 80%.

As can be seen from the results obtained, it is recognized that although the film thickness distribution is improved within a range for the aperture diameter increasing rate from about 0 to 40%, the film thickness distribution is rather increased if it exceeds 40%, and the film thickness distribution is further increased if it exceeds 60%, than the case where the aperture diameter is unchanged (aperture diameter increasing rate 0%). The film property shows a relationship substantially correlated with the film thickness distribution. The trend is substantially the same also under other film forming conditions.

Accordingly, in the present invention, it is desirable to set the aperture diameter increasing rate, preferably, from 0 to 50% and, more preferably, from 20 to 40%.

Figure 2B:
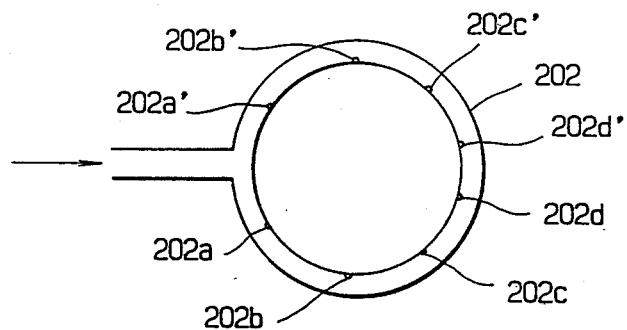

Then, FIGS. 6 shows the results of the experiments conducted under the same film forming conditions as above by using the gas liberation ring 202 shown in FIG. 2(b).

In the gas liberation ring 202 shown in FIG. 2(b), eight liberation apertures 202a–202d and 202a'–202d' of an identical aperture diameter are perforated with the distance being gradually decreased with reference to the distance between the liberation apertures 202a and 202a', and the change of the film thickness distribution of the deposited film formed by using each of the gas liberation rings manufactured while varying the decreasing rate from 0 to 70% is shown in FIG. 6.

From the results obtained, it has been found that while the film thickness distribution is improved within a range for the inter-aperture distance decreasing rate from 0 to 40%, the film thickness distribution is rather increased if it exceeds 40% and the film thickness distribution is further increased if it exceeds 50% than in the case where the aperture distance is unchanged (inter-aperture distance decreasing rate: 0%).

The film property shows the relationship substantially correlated with the film thickness distribution. The trend is substantially the same also under other film forming conditions.

Accordingly, in the present invention, it is desirable to set the inter-aperture distance decreasing rate to, preferably, a range of from 0 to 50% and, more preferably, a range of from 20 to 40%.

Figure 2C:
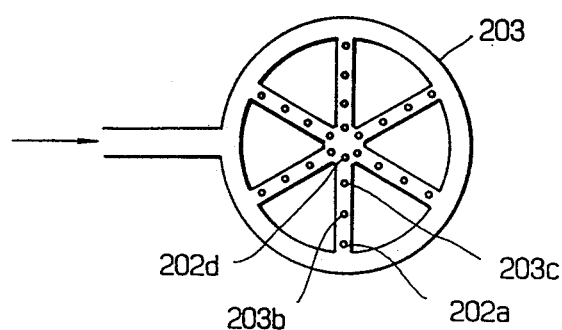

Further, the same experiments as that for determining the relationship shown in FIG. 5 were conducted by using the gas liberation ring 203 shown in FIG. 2(c). In the gas liberation ring 203 shown in FIG. 2(c), liberation apertures 203a–203d are uniformly distributed and the aperture diameter is increased in the direction from 203a to 203d. The trend in the change of the film thickness distribution and the film property obtained by using gas liberation rings having various increasing rates was substantially the same as the results shown in FIG. 5.

Accordingly, in the case of the distribution for the gas liberation apertures as shown in FIG. 2(c) in the present invention, it is desirable to set the aperture diameter increasing rate to preferably, to a range of from 0 to 40% and, more preferably, a range of from 10 to 30%.

In the present invention, the inner pressure of the film forming stage upon film formation may properly be determined depending on the conditions for stably forming a microwave plasma from a hydrogen gas or a gas mixture composed of a hydrogen gas and a rare gas, as well as the kind and the state selected for the compound (1), (2) and (3), as well as desired property of the deposited films, etc. It is desirable to set the inner pressure to preferably a range of from 100 to $1 \times 10^{-4}$ Torr, more preferably, a range of from 10 to $5 \times 10^{-4}$ Torr and, most preferably, a range of from 1 to $1 \times 10^{-3}$ Torr.

By the method according to the present invention, a deposited film having desired crystallinity can be formed on a substrate of any crystallinity irrespective of its amorphous or crystalline property.

In the present invention, the oscillation mode in the microwave oscillator, in order to establish a stable cavity resonance condition, is a continuous oscillation mode, having a ripple in the power range used preferably within a range of 30 %.

By the process according to the present invention, hydrogen atoms in excited state can be formed with good controllability, stably and with good reproducibility by a microwave plasma using a cavity resonator integrated with two impedance matching circuits in a microwave circuit, whereby the controllability for the reaction between the hydrogen atoms in excited state and the film-forming raw material compound may be remarkably improved and a group II–VI semiconductor film having desired properties, desired crystallinity and hydrogen content, may be formed with good uniformity, high efficiency and good reproducibility.

Description will be made for typical embodiments of the deposited film forming apparatus suitable for practicing the process according to the present invention but it should be noted that the present invention is not restricted only to such a deposited film forming apparatus.

FIG. 1 is a perspective view schematically illustrating the constitution of the deposited film forming apparatus suitable for practicing the process according to the present invention.

In FIG. 1, a cylindrical cavity resonator 101 comprises a bell jar 102 as a microwave plasma generation chamber, a metal mesh member 103, a cavity length varying plunger 104, a rectangular waveguide tube 108 and a restriction 110 as the main constituent components. A spring 105 made of phosphor bronze is disposed for improving the contact between the plunger 102 and the cylindrical cavity resonator 101 to prevent abnormal electric discharge. The cavity length varying plunger 104 can be moved by a motor 106 and a speed change gear 107 toward the bell jar 102. An E-H tuner or a three-stub tuner 109 constitutes one of impedance matching circuits constituting a microwave circuit in the present invention, which is used for the impedance matching being paired with the resonance length varying plunger 104 as the other of the impedance matching circuits. The restriction 110 constitutes one of the impedance circuits in the same manner and it is used being paired with the cavity length varying plunger 104.

Restrictions 110 are disposed in a pair on the right and left the junction between the rectangular waveguide tube 108 and the cylindrical cavity resonator 101 and so adapted that they can be moved slindingly along the cylindrical surface of the rectangular waveguide tube 108 in the longitudinal direction independent of each other and kept in contact with the cylindrical cavity resonator 101 by means of springs made of phosphor bronze not illustrated.

A liberation aperture for a hydrogen gas or a gas mixture of a hydrogen gas and a rare gas from a gas introduction pipe 111 is passed through the metal mesh member and directed to the inside of the bell jar 102.

Hydrogen gas, etc. introduced into the bell jar 102 is converted into a plasma by microwaves charged into the cavity resonator 101 to form hydrogen atoms, etc. in an excited state, which are then introduced through the metal mesh member 103 into the film forming space 116. The pressure in the film forming space is measured by a pressure gage 125.

In the film forming space 116, a raw material gas liberation ring 112 for forming a deposited film is disposed between a substrate 118 and a substrate holder 119.

An activation space 114 is used for previously activating the film-forming raw material as introduced from a gas supply pipe 120, if necessary, around which activating energy generation means 115 for generating energy such as heat, light, electric discharge is disposed.

In a case where the previously activated film-forming raw material gas is introduced, it is desirable that a transportation pipe 117 has such a diameter and consists of such material as capable of maintaining the activated state. For the gas liberation ring 112, gas liberation apertures 113 of the constitution as explained in FIG. 2 are formed.

The film-forming raw material gas, etc. introduced into the film forming space 116 is evacuated in the direction of the arrow shown in the drawing by means of an evacuation pump not illustrated.

A port 121 is disposed for the monitor of a microwave plasma, to which a light gathering probe 122 is connected. The light gathering probe 122 is connected by way of a quartz fiber 123 to a spectrometer not illustrated for conducting emission spectrophotometry. Reference numeral 124 denotes a stand-by port for the monitor of the plasma on the side of the film forming space.

DESCRIPTION OF THE PREFERRED — EMBODIMENTS

The process for the formation of a deposited film according to the present invention will be described more in detail referring to the following examples.

It should, however, be noted that the present invention is not restricted only to these examples.

EXAMPLE 1

At first, a glass substrate 118 of 150$\phi$ diameter (trade name: #7059, manufactured by Coning Glass Works) was placed on the substrate holder 119 in the film forming space 116, and the pressure in the film forming space 116 was reduced to $1 \times 10^{-6}$ Torr by evacuation using an evacuation pump not illustrated. Then, the substrate holder was heated such that the surface temperature of the substrate 118 was set to 150° C. by means of a substrate temperature controller not illustrated.

When the surface temperature of the substrate was settled, a mixture of $H_2$ gas at 30 sccm and Ar gas at 200 sccm was introduced from gas reservoirs not illustrated by way of the gas introduction pipe 111 to the quartz bell jar 102. Then, the pressure in the film forming space 116 was controlled to 0.1 Torr by using an automatic pressure controller not illustrated.

Then, microwave was charged from a continuous oscillation type microwave oscillator not illustrated by way of the rectangular waveguide tube 108 into the cavity resonator 101. Soon after, the cavity length varying plunger 104 is operated by the motor 106 and the speed change gear 107 and adjusted to such a position that the ratio of the reflection power/incident power measured by a power monitor disposed in a microwave circuit not illustrated and further the opening degree of the restrictions 110 was adjusted to such a position to minimize the ratio of the reflection power/incident power. Then, the operations for finely adjusting the position of the cavity length varying plunger 104 and the opening degree for the restrictions 110 were repeated so that the ratio of the reflection power-incident power was minimized and the value for the effective incident power represented by incident power-reflection power was set to 350 W.

At this instance, the intensity ratio of emission lines $H_\alpha/H_\beta$ from the hydrogen atoms in the excited state monitored through the port 111 was 90.

The substrate 118 and the metal mesh member 103 were set at a distnce of 40 mm in parallel with each other. A punched board made of aluminum having 150$\phi$ diameter in which apertures each of 8$\phi$ diameter were uniformly distributed with the porosity of 50%, was used as the metal mesh member 103. The gas liberation ring 112 used had a constitution as shown in FIG. 2(a) in which the aperture diameter corresponding to 201a, 201a' was 1.5 mm and the increasing rate of aperture diameter was 30%.

Subsequently, a mixture of $Zn(CH_3)_2/LiC_3H_7$(10,000:1) bubbled with He gas as a carrier gas at 10 sccm and $SeH_2$ gas at 10 sccm from gas reservoirs and bubbling device (not illustrated) were mixed and introduced through the gas supply pipe 120 and from the gas liberation ring 112 into the film forming space 116. In this case, the pressure in the film forming space 116 was controlled by an automatic pressure controller so as to be maintained at 0.1 Torr. $LiC_3H_7$ also has a function as a dopant.

Soon, the hydrogen atoms in the excited state $Zn(CH_3)_2$, $Li_3C_3H_7$ and $SeH_2$ caused chemical reaction to from a ZnSe:H:Li film of 4.0 $\mu$m film thickness on the substrate 118 within 20 min (specimen No. 1—1)

After cooling and then taking out the substrate and replacing it with a 6 inch n+Si (111) wafer, the deposited film was formed under the same procedures as described above except for changing the $H_2$ gas flow rate to 50 sccm, the pressure in the film forming space to 0.08 Torr and the substrate temperature to 200° C. The intensity ratio of $H_\alpha/H_\beta$ in this case was 45 (specimen No. 1-2).

When the film thickness distribution was measured and the crystallinity of the deposited film was evaluated by X-ray diffractiometry and electron ray diffractiometry (RHEED) on each of the deposited film specimens obtained, it was confirmed that the film thickness distribution was within ±3% for each of the specimens and that the specimen No. 1—1 was a polycrystalline film with the grain size of about 2 $\mu$m, while the specimen No. 1-2 was an epitaxial film having nearly (111) orientation at the surface in parallel with the substrate.

When a portion was cut out from each of the specimens and put to composition analysis by SIMS, each of the specimens had about 1:1 atomic composition ratio for Zn and Se thus satisfying the stoichiometrical relationship and the H content was 40 atomic % for the specimen No. 1—1 and 0.5 atomic % for the specimen No. 1-2.

Each of the specimens was put into a vacuum deposition device and vapor deposited with a comb-type Al electrode of $\phi$2 diameter by means of ohmic heating and, when the hole mobility ($u_h$) was measured by van der Pauw method, it was 4.5±0.15 cm$^2$/V.sec for the sepciment No. 1—1 and 18.2±0.5 cm$^2$/V.sec for the specimen No. 1-2 within the entire surfaces and the characteristic distribution was about ±3%. Further, when the conduction type was examined by a thermovoltatic power measurement, all of them were of p type.

From the foregoings, it has found that the crystallinity can be controlled with ease according to the present invention.

EXAMPLE 2

Two kinds of ZnTe:H:P films were formed by the same procedures as those in Example 1 except for setting the H$_2$ gas flow rate to 50 sccm (specimen No. 2-1) and 100 sccm (specimen No. 2—2) and the microwave charging power to 200 W under the conditions as described below.

A glass substrate (#7059) of 50φ diameter was used as the substrate. Zn(CH$_3$)$_2$ bubbled with H$_2$ gas at 20 sccm, PF$_5$ (diluted with He to 800 ppm) at 15 sccm and Fe(C$_2$H$_5$)$_2$ bubbled with He gas at 15 sccm were introduced into the film forming space, the pressure in the film forming space was set to 0.2 Torr and the substrate temperature was set to 200° C. Films were formed using the same gas liberation ring, metal mesh member and substrate position as those in Example 1.

H$_\alpha$/H$_\beta$ ratio upon film formation was 180 for the specimen No. 2-1 and 120 for the specimen No. 2—2.

When each of the specimens of the deposited films thus obtained was evaluated, the results as shown in Table 2 were obtained.

Each of the properties was within a range of ±3% in the surface. From the foregoings, it has been found that the crystal grain size, hydrogen content, etc. can be controlled with ease by the present invention.

EXAMPLE 3

Deposited films were formed in the same procedures as in Example 1 except for changing the microwave charging power from 350 W to 200 W, and heating the activation space 114 constituted with the quartz tube disposed on the gas supply pipe 120 to 700° C. by means of the infrared heating furnace 115 as the activating energy generation means (specimen No. 3-1, No. 3-2).

H$_\alpha$/H$_\beta$ ratio upon film formation was 120.

When the deposited films obtained were evaluated in the same procedures, the deposition rate was increased by about 10% although the microwave charging power was reduced, and substantially the same properties as those obtained in Example 1 could be obtained as shown in Table 3.

EXAMPLES 4–6

Deposited films were formed under the same procedures and film forming condition as those in Example 2 except for changing the film-forming material compound and a portion of the film forming conditions with those shown in Table 4.

When the film property was evaluated for the deposited films obtained, the results as shown in Table 5 were obtained and all of them were of high quality having the distribution of the film thickness and the film properties within a range of ±3%.

EXAMPLE 7

A deposited film was formed under the same procedures and film forming conditions as those in Example 1 except for replacing LiC$_3$H$_7$ as the dopant material with Ga(CH$_3$)$_3$, introducing Se(C$_2$H$_5$)$_2$ while being bubbled with He gas at 3 sccm and changing the distance between the substrate and the metal member to 55 cm.

When the composition of the thus obtained deposited film was evaluated by SIMS, it has been confirmes to be a ZnSn$_{0.1}$Te$_{0.9}$:H:Ga film. Further, H content was 2.0 atomic %.

The electron mobility was 200 cm$^2$/V.sec and the conduction type was n type.

TABLE 2

| Item | Specimen No. 2-1 | Specimen No. 2-2 |
| --- | --- | --- |
| Crystal grain size | 0.5 μm | 1.2 μm |
| H content | 3.8 atomic % | 1.2 atomic % |
| Hole Mobility | 200 cm$^2$/v. sec | 350 cm$^2$/v. sec |
| Conduction type | p type | p type |

TABLE 3

| Item | Specimen No. 3-1 | Specimen No. 3-2 |
| --- | --- | --- |
| Crystal grain size | 1.9 μm | Epitaxial |
| H content | 3.8 atomic % | 0.6 atomic % |
| Hole Mobility | 4.3 cm$^2$/v. sec | 18.5 cm$^2$/v. sec |
| Conduction type | p type | p type |

TABLE 4

| Example | Raw material compound and flow rate | | Change of film forming condition | |
| --- | --- | --- | --- | --- |
| 4 | Zn(C$_2$H$_5$)$_2$:Al(CH$_3$)$_3$ = 10$^4$:1/He | 20 sccm | Microwave power | 250 W |
| | | | H$_\alpha$/H$_\beta$ = | 150 |
| | H$_2$S | 15 sccm | Constitution of the liberation nozzle | |
| | H$_2$/Ar | 20/150 sccm | in FIG. 2(b) (aperture: φ 2, interval decrease rate: 20%) | |
| 5 | Cd(CH$_3$)$_2$/He | 20 sccm | Microwave power | 300 W |
| | PF$_5$(diluted with He to 800 ppm) | | Pressure | 0.12 Torr |
| | | | H$_\alpha$/H$_\beta$ = | 40 |
| | | 6 sccm | Substrate: p$^+$-GaAs wafer | |
| | H$_2$S | 20 sccm | | |
| | H$_2$/Ar | 80/200 sccm | | |
| 6 | Cd(CH$_3$)$_2$/LiC$_3$H$_7$ = 10$^4$:1/He | 25 sccm | Microwave power | 150 W |
| | | | H$_\alpha$/H$_\beta$ = | 180 |
| | Te(CH$_3$)$_2$/He | 15 sccm | Cd(CH$_3$)/LiC$_3$H$_7$/Te(CH$_3$)$_2$/He activated | |
| | H$_2$ | 100 sccm | in activation chamber by RF glow discharge (100 W) and introduced | |

TABLE 5

| Example | Film quality | Crystal grain size | H content | $\mu_e$ or $\mu_h$ | Conduction type |
|---|---|---|---|---|---|
| 4 | ZnS:H:Al | 1.8 μm | 2.5 atomic % | $\mu_e$:45 cm²/v·sec | n |
| 5 | Cds:H:P | epitaxial | 0.05 atomic % | $\mu_h$:16 cm²v.sec | p |
| 6 | CdTe:H:Li | 2.5 μm | 3.2 atomic % | $\mu_h$:20 cm²/v.sec | p |

What we claim is:

1. A process for the formation of a functional deposited film containing atoms belonging to the group II and VI of the periodical table as the main constituent atoms by introducing, into a film forming space for forming a deposited film on a substrate disposed therein, a compound (1) and a compound 2) represented respectively by the following general formulae (I) and (II) as the film-forming raw material and, if required, a compound (3) containing an element capable of controlling valence electrons for the deposited film as the constituent element each in a gaseous state, or in a state where at least one of such compounds is previously activated in an activation space disposed separately from said film forming space, while forming hydrogen atoms in excited state which cause chemical reaction with at least one of said compounds (1), (2) and (3) in the gaseous state or in the activated state in an activation space different from said film forming space and introducing them into the film-forming space, thereby forming the functional deposited film on said substrate, wherein said hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$R_nM_m \quad (I)$$

$$A_aB_b \quad (II)$$

where m represents a positive integer equal to or multiple integer of the valence number for R, n represents a positive integer equal to or multiple integer of the valence number for M, M represents an element belonging to the group II of the periodical table, R represents a member selected from hydrogen (H), halogen (X) and hydrocarbon group, a represents a positive integer equal to or multiple integer of the valence number for B, b represents a positive integer equal to or multiple integer of the valence number for A and A represents an element belonging to the group VI of the periodical table, B represents a member selected from hydrogen (H), halogen (X) and hydrocarbon group.

2. A process for the formation of a functional deposited film as defined in claim 1, wherein the excited state of the hydrogen atoms is controlled by measuring the emission intensity of $H_\alpha/H_\beta$, which is the excited state of the hydrogen atoms, by means of emission spectraphotometry and controlling at least one of the parameters of microwave power to be charged into the cavity resonator, impedance matching condition, hydrogen gas flow rate, flow rate of the gas mixture composed of hydrogen gas and rare gas and total pressure so as to attain a desired value for said intensity ratio.

3. A process for the formation of a functional deposited film as defined in claim 1 or 2, wherein the impedance matching circuit in the cavity resonator integrated with the two impedance matching circuits in the microwave circuit is restriction means disposed to a cavity length varying plunger or to the junction portion between the microwave guide tube and the cavity resonator, and the impedance matching condition is controlled by adjusting them.

4. A process for the formation of a functional deposited film as defined in claim 3, wherein the impedance matching circuit is the cavity resonance varying plunger and an E-H tuner or a three stub tuner.

5. A process for the formation of a functional deposited film as defined in claim 1, wherein the plasma generation chamber comprises a metal mesh member and a microwave permeable bell jar and is connected by way of said metal mesh member to said film forming space.

6. A process for the formation of a functional deposited film as defined in claim 5, wherein the hydrogen atoms in the excited state are introduced through the metal mesh member into the film forming space.

7. A process for the formation of a functional deposited film as defined in claim 5, wherein the substrate is disposed at an angle of 30 degree or less relative to the horizontal axis of the metal mesh surface and at a distance within 100 mm from said metal mesh surface, and the compound (1), (2) and (3) in the gaseous state or in activated state are introduced from the gas liberation means disposed between said metal mesh surface and said substrate into the film forming space.

8. A process for the formation of a functional deposited film as defined in claim 7, wherein the gas liberation means is disposed so as to surround the substrate in an annular manner, the interval of the gas liberation apertures is gradually decreased from the side of introducing the gas to the final liberation aperture of said gas liberation means, so that the gas liberation amount from the respective gas liberation apertures may be unified.

9. A process for the formation of a functional deposited film as defined in claim 7, wherein the gas liberation means is disposed so as to surround the substrate in an annular manner and the diameter for the gas liberation apertures is gradually increased from the side of introducing the gas to the final liberation aperture of said gas liberation means, so that the gas liberation amount from the respective gas liberation apertures may be unified.

10. A process for the formation of a functional deposited film as defined in claim 7, wherein the gas liberation apertures of the gas liberation means are uniformly distributed at least within the plane of the substrate and the aperture diameter for the respective gas liberation apertures is gradually increased from the side of introducing the gas to the central portion of the gas liberation means, so that the gas liberation amount from the respective gas liberation apertures may be unified.

* * * * *

UNITED STATES PATENT AND TRADEMARK OFFICE
CERTIFICATE OF CORRECTION

PATENT NO. : 4,908,329

DATED : March 13, 1990

INVENTOR(S) : MASAHIRO KANAI, ET AL.

It is certified that error appears in the above-identified patent and that said Letters Patent is hereby corrected as shown below:

IN [57] ABSTRACT

Line 3, "periodical table" should read
--periodic table--.

COLUMN 1

Line 19, "atomson" should read --atoms on--.
Line 36, "regards" should read --regard--.
Line 48, "said" should be deleted.

COLUMN 2

Line 21, "film:" should read --film;--.
Line 28, "instable:" should read --unstable:--.
Line 31, "it has" should read --there have--.
Line 33, "diversed along the diversing" should read
--diverted along the divisions in the--.
Line 62, "substrated" should read --substrate--.

COLUMN 3

Line 19, "periodical table" should read
--periodic table--.

UNITED STATES PATENT AND TRADEMARK OFFICE
CERTIFICATE OF CORRECTION

PATENT NO. : 4,908,329

DATED : March 13, 1990

INVENTOR(S) : MASAHIRO KANAI, ET AL.

It is certified that error appears in the above-identified patent and that said Letters Patent is hereby corrected as shown below:

COLUMN 4

Line 42, "cause" should read --causes--.
Line 58, "AaBb        (II)" should read --¶ AaBb        (II)--.
Line 63, "periodical table," should read --periodic table,--.

COLUMN 5

Line 1, "periodical" should read --periodic--.
Line 38, "round," should read --round--.

COLUMN 6

Line 6, "H" should read --Hα--.
Lines 53-54, "take place" should read --undergo--.
Line 64, "periodical table," should read --periodic table,--.

COLUMN 7

Line 14, "etc" should read --etc.--.
Line 19, "Te($CH_2H_5$)$_2$," should read --Te($C_2H_5$)$_2$,--.
Lines 33-34, "periodical" should read --periodic--.
Line 47, "element;" should read --element:--.

UNITED STATES PATENT AND TRADEMARK OFFICE
CERTIFICATE OF CORRECTION

PATENT NO. : 4,908,329
DATED : March 13, 1990
INVENTOR(S) : MASAHIRO KANAI, ET AL.

Page 3 of 6

It is certified that error appears in the above-identified patent and that said Letters Patent is hereby corrected as shown below:

Line 48, "$N_2H_4NH_4N_3$," should read --$N_2H_4$, $NH_4N_3$,--.
    Line 51, "$P_4H_2$," should read --$P_2H_4$,--.
    Line 65, "I:" should read --I,--.
    Line 68, "above:" should read --above,--.

COLUMN 8

Line 10, "I:" should read --I,--.
    Line 13, "above:" should read --above,--.
    Line 25, "I:" should read --I,--.
    Line 28, "above:" should read --above,--.

COLUMN 9

Line 41, "metal mesh member 70" should read --metal mesh member 709--.
    Line 68, "then" should read --them--.

COLUMN 10

Line 1, "from" should read --form--.

COLUMN 11

Line 45, "a" should be deleted.
    Line 61, "30 degree" should read --30 degrees--.

UNITED STATES PATENT AND TRADEMARK OFFICE
CERTIFICATE OF CORRECTION

PATENT NO. : 4,908,329

DATED : March 13, 1990

INVENTOR(S) : MASAHIRO KANAI, ET AL.

It is certified that error appears in the above-identified patent and that said Letters Patent is hereby corrected as shown below:

COLUMN 12

Line 37, "compound" should read --compounds--.
    Line 60, "apertured" should read --spaced--.

COLUMN 13

Line 16, "FIGS. 6" should read --FIG. 6--.
    Line 59, "to" (second occurrence) should be deleted.
    Line 68, "pound" should read --pounds--.

COLUMN 14

Line 57, "left" should read --left of--.

COLUMN 15

Line 47, "Coning Glass Works)" should read --Corning Glass Works)--.

COLUMN 16

Line 37, "from" should read --form--.
    Line 38, "(specimen No. 1-1)" should read --(specimen No. 1-1).--.

UNITED STATES PATENT AND TRADEMARK OFFICE
CERTIFICATE OF CORRECTION

PATENT NO. : 4,908,329

DATED : March 13, 1990

INVENTOR(S) : MASAHIRO KANAI, ET AL.

It is certified that error appears in the above-identified patent and that said Letters Patent is hereby corrected as shown below:

COLUMN 17

Line 1, "sepciment No. 1-1" should read --specimen No. 1-1--.
Line 7, "foregoings, it has found" should read --foregoing, it has been found--.
Line 20, "15 sccm" should read --5 sccm--.
Line 33, "foregoings," should read --foregoing,--.

COLUMN 18

Line 25, "confirmes" should read --confirmed--.

COLUMN 19

Line 12, "periodical table" should read --periodic table--.
Line 15, "compound 2)" should read --compound (2)--.
Line 45, "periodical table," should read --periodic table,--.
Line 51, "periodical" should read --periodic--.

UNITED STATES PATENT AND TRADEMARK OFFICE
CERTIFICATE OF CORRECTION

PATENT NO. : 4,908,329

DATED : March 13, 1990

INVENTOR(S) : MASAHIRO KANAI, ET AL.

Page 6 of 6

It is certified that error appears in the above-identified patent and that said Letters Patent is hereby corrected as shown below:

COLUMN 20

Line 35, "compound (1), (2) and (3)" should read --compounds (1), (2) and (3)--.

Signed and Sealed this

Twelfth Day of November, 1991

Attest:

HARRY F. MANBECK, JR.

*Attesting Officer*   *Commissioner of Patents and Trademarks*